(12) United States Patent
Zhang et al.

(10) Patent No.: US 8,325,448 B2
(45) Date of Patent: Dec. 4, 2012

(54) PINNING FIELD IN MR DEVICES DESPITE HIGHER ANNEALING TEMPERATURE

(75) Inventors: Kunliang Zhang, Fremont, CA (US); Shengyuan Wang, Fremont, CA (US); Tong Zhao, Fremont, CA (US); Min Li, Fremont, CA (US); Hui-Chuan Wang, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 2 days.

(21) Appl. No.: 12/931,849

(22) Filed: Feb. 11, 2011

(65) Prior Publication Data

US 2012/0205757 A1 Aug. 16, 2012

(51) Int. Cl.
*G11B 5/127* (2006.01)
(52) U.S. Cl. .................................................... 360/319
(58) Field of Classification Search ................ 360/324.2
See application file for complete search history.

(56) References Cited

U.S. PATENT DOCUMENTS

| | | | |
|---|---|---|---|
| 6,529,353 B2 | 3/2003 | Shimazawa | |
| 6,853,520 B2 * | 2/2005 | Fukuzawa et al. | 360/324.1 |
| 6,934,131 B2 * | 8/2005 | Mao et al. | 360/324.11 |
| 6,947,264 B2 * | 9/2005 | Gill | 360/324.2 |
| 6,954,342 B2 * | 10/2005 | Kula et al. | 360/324.11 |
| 7,130,163 B2 * | 10/2006 | Fukuzawa et al. | 360/324.1 |
| 7,239,489 B2 * | 7/2007 | Lin et al. | 360/324.2 |
| 7,377,025 B2 | 5/2008 | Zhao et al. | |
| 7,750,421 B2 | 7/2010 | Horng et al. | |
| 7,780,820 B2 | 8/2010 | Zhao et al. | |

* cited by examiner

*Primary Examiner* — Mark Blouin
(74) *Attorney, Agent, or Firm* — Saile Ackerman LLC; Stephen B. Ackerman

(57) ABSTRACT

The pinning field in an MR device was significantly improved by using the Ru 4A peak together with steps to minimize interfacial roughness of the ruthenium layer as well as boron and manganese diffusion into the ruthenium layer during manufacturing. This made it possible to anneal at temperatures as high as 340° C. whereby a high MR ratio could be simultaneously achieved.

24 Claims, 4 Drawing Sheets

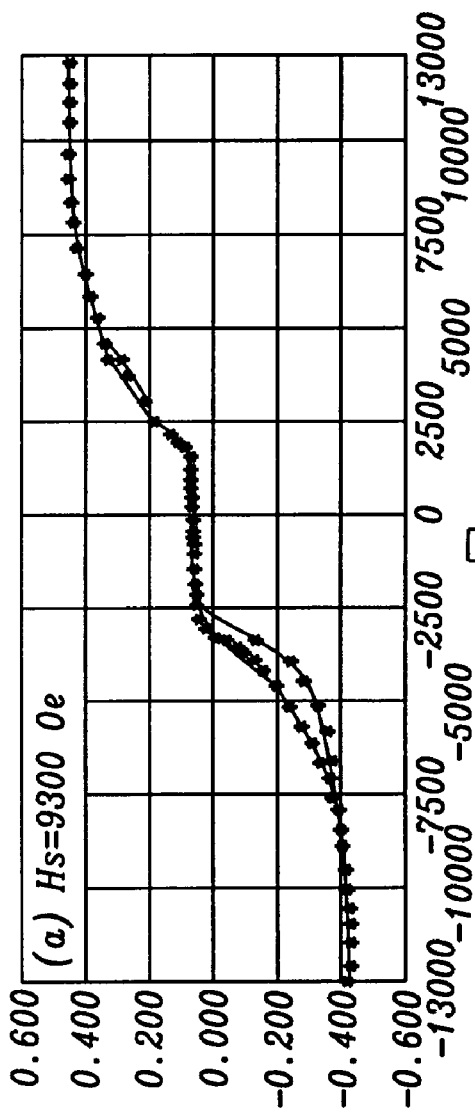
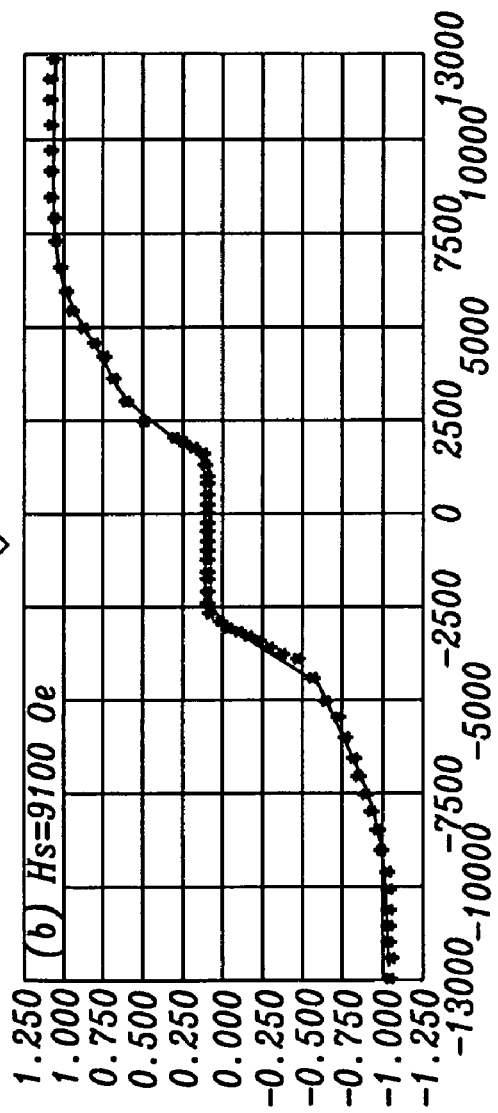
FIG. 2a
FIG. 2b

PINNING FIELD IN MR DEVICES DESPITE HIGHER ANNEALING TEMPERATURE

FIELD OF THE INVENTION

The invention relates to the general field of magneto-resistive devices with particular attention the simultaneous improvement of both the MR ratio and the pinning strength of the SyAP portion of the device.

BACKGROUND OF THE INVENTION

RKKY (Ruderman-Kittel-Kasuya-Yosida) coupling is a particular type of magnetic coupling due to interaction between the conduction electrons, making possible the creation, and widespread use of, synthetic AntiParallel (SyAP) structures (AP2/Ru/AP1). For MgO barrier based tunneling magneto-resistive (TMR) sensors, a typical structure would comprise:

Seed/antiferromagnetic (AFM) layer/AP2/Ru/AP1/MgOx/free layer/capping layer.

A ruthenium thickness of 7.5 Angstroms (Ru7.5) is commonly used in the AP2/Ru/AP1 portion because it is easy to control and is not too sensitive to Ru interfacial condition changes. However, as device and film stack size become ever smaller, the pinning field, which is limited by the saturation field of the SyAP (Hs), has to be correspondingly larger to ensure device stability.

Although the saturation magnetization Hs typically increases with the reduced magnetic moments of the AP2 and AP1 layers, and also with the moment difference between AP2 and AP1, the MR ratio will suffer once the layers become thinner than some critical value. Thus, at some point, SyAP with Ru7.5 will no longer be capable of producing sufficient Hs.

In current MgO based TMR, a higher annealing temperature will typically produce a higher TMR ratio and hence higher amplitude. So it would be desirable to anneal the TMR sensor at a higher annealing temperature if there were no adverse effects on other magnetic properties such as free layer coercivity and pinning strength. However, a comparison of FIGS. 1(a) and 1(aa), for a Ru7.5 SyAP shows how going to a higher annealing temperature, such as from 280° C. to 320° C. (for 2 hours in each case), reduces Hs from 7,600 to 6,000 Oe. This reduction in pinning field strength is even greater for the Ru4 SyAP system as can be seen by comparing FIGS. 1(b) and 1 (bb) where the synthetic exchange coupling has been almost destroyed. Note that in FIGS. 1(a) through 1(bb) relative units are used on the Y-axis. Hs is defined as the minimum value of the applied field (X-axis) beyond which the induced magnetization (Y-axis) remains unchanged within 5%.

Thus, further optimization of the SyAP is necessary to ensure a robust pinning field despite the use of higher temperature annealing such as 300° C. and above. However, to improve the magneto-resistive (MR) ratio of a tunneling MR (TMR) sensor, a higher annealing temperature is needed. So the problem outlined in the preceding paragraph has to be dealt with if we are to be able to achieve higher amplitudes for TMR sensors.

A routine search of the prior art was performed with the following references of interest being found:

U.S. Pat. No. 7,780,820 (Zhao et al—Headway) teaches that the annealing temperature needs to be lower than 300° C. U.S. Patent Application 2002/0097537 (Shimizawa) teaches first annealing at a temperature of 250° C., then at a lower temperature of 210° C. U.S. Patent Application 2009/0027810 (Horng et al—Headway) shows a CoFe layer on Ru under the AP1 layer. U.S. Pat. No. 7,377,025 (Zhao et al—Headway) discloses a plasma treatment of the AP1 layer, but not prior to forming the Ru layer.

SUMMARY OF THE INVENTION

It has been an object of at least one embodiment of the present invention to provide a method for combining both a high internal pinning strength and a high MR ratio in the same MR device.

Another object of at least one embodiment of the present invention has been to provide a TMR device manufactured according to said method.

Still another object of at least one embodiment of the present invention has been to provide a process for manufacturing said TMR device.

A further object of at least one embodiment of the present invention has been to reduce the thickness of such a TMR device in order to improve pattern resolution.

These objects have been achieved by reducing interfacial roughness of the ruthenium layer located between AP1 and AP2, by minimizing boron diffusion from AP1 into the ruthenium, and by minimizing manganese diffusion from the AFM layer into the ruthenium layer.

Specifically, a plasma treatment after AFM deposition, but before Ru deposition, has been added to the manufacturing process to reduce the development of interfacial roughness during Ru layer growth. Additionally, a thin $CoFe_x$ layer is laid down immediately after Ru deposition to block boron diffusion from the AP1 layer:

Finally, as an optional feature, a surfactant layer or a nano-oxide layer may be inserted within AP2.

BRIEF DESCRIPTION OF THE DRAWINGS

FIGS. 2a and 2b show MH loops for samples, formed using the rules claimed by the invention whereby saturation magnetizations of 9300 and 9100 Oe, respectively, were achieved even after annealing at 320° C.

DESCRIPTION OF THE PREFERRED EMBODIMENTS

Figure 1A:
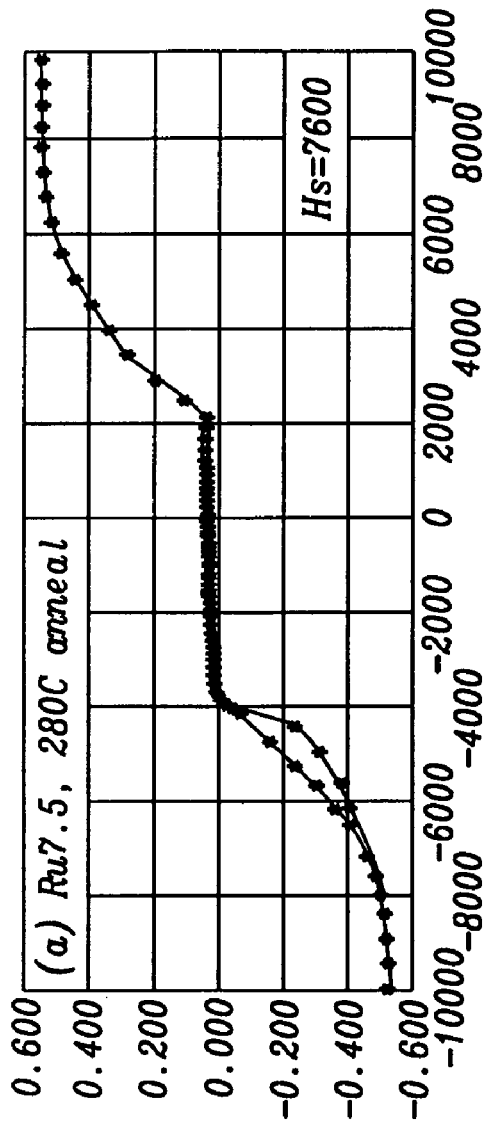
FIGS. 1a and 1aa compare MH loops for synthetic antiparallel structures, formed under prior art rules, based on Ru7.5 following annealing at 280 and 320° C., respectively.
Figure 1A:
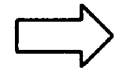
Figure 1A:
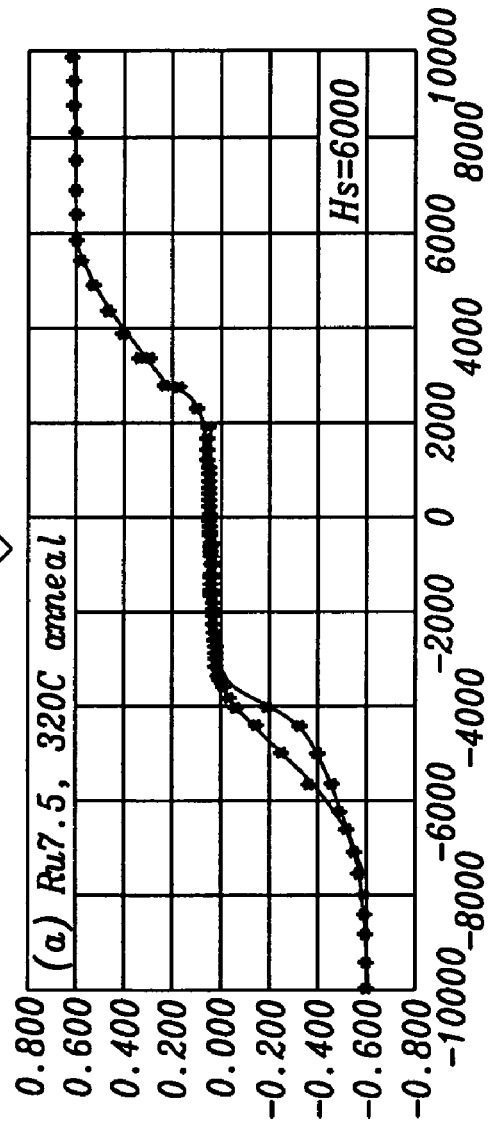
Figure 1B:
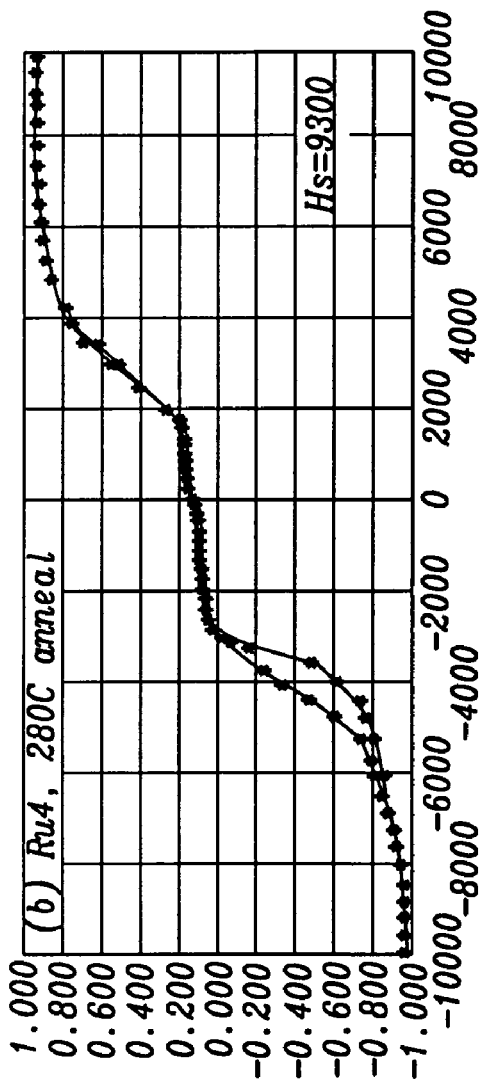
FIGS. 1b and 1bb compare MH loops for synthetic antiparallel structures, formed under prior art rules, based on Ru4 following annealing at 280 and 320° C., respectively.
Figure 1B:
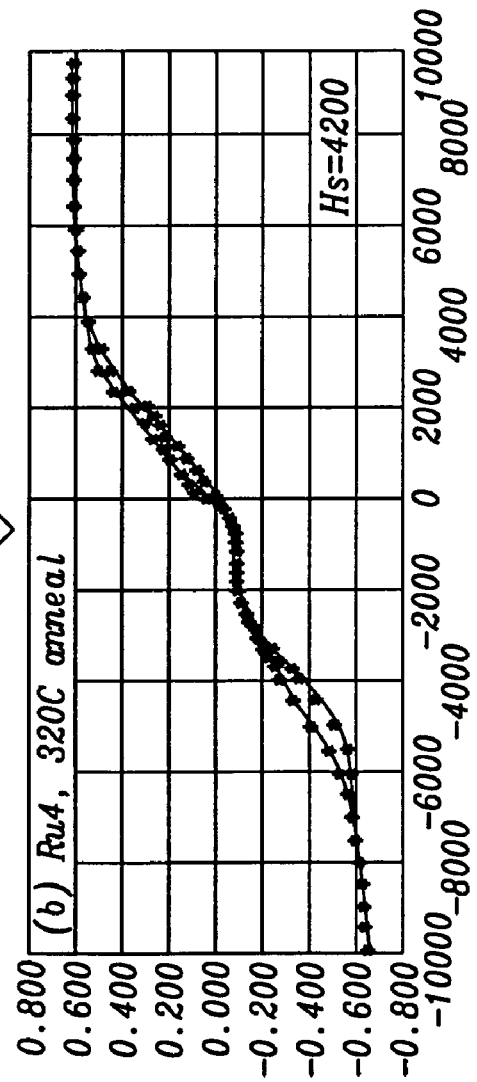

The invention discloses how, using an improved SyAP based on the Ru first peak (Ru 4A), ensures a high Hs for a TMR sensor, thereby enabling a higher annealing temperature to be used with said TMR sensor which in turn leads to a higher MR ratio.

As noted earlier, SyAP with a Ru first peak at Ru4A has, intrinsically, a much greater Hs field than with a Ru second peak at Ru7.5A. Therefore, in order to retain the pinning strength needed to ensure good device performance after exposure to the higher annealing temperature, we have to improve the pinning properties of Ru4A SyAP systems.

In order to accomplish this, we need to eliminate, or greatly reduce, the Hs degradation that occurs at higher annealing temperature. We have determined that this Hs degradation is due to the following factors:

1) increased Ru interfacial roughness due to grain growth at the higher annealing temperature;
2) boron diffusion from the AP1 CoFeB material into the Ru interface; and
3) manganese diffusion from the antiferromagnetic (AFM) material, such as IrMn, into the Ru layer (after passing through AP2).

Minimizing the above items will therefore lead to the desired improvement in Hs for Ru SyAP systems. The invention teaches two ways that are essential for achieving this:
1) Introducing a plasma treatment (PT) after the AFM deposition and before the Ru deposition:
   i.e. seed/AFM/AP2/PT/Ru4/AP1/MgO/free layer/capping layer.

This serves to reduce the development of interfacial roughness during Ru layer growth. The plasma treatment involves plasma etching or ion beam etching (usually in argon) at a power level in a range of 5-50 watts with a gas flow rate of 30 to 200 SCCM for about 20 to 600 sec.

The PT can be applied to the top surface of the AFM layer, during deposition of (i.e. within) the AP2 layer, to the top surface of the AP2 layer, or to any combination of these three locations. In general, we have found application of the plasma treatment to the top surface of the AP2 layer to be the easiest of these three processes to implement.
2). Inserting a thin $CoFe_x$ layer of thickness t immediately after the Ru layer deposition to block boron diffusion from the AP1 (CoFeB) Layer:
   i.e. seed/AFM/AP2/PT/Ru4/$CoFe_x$/t/AP1/MgO/free layer/capping layer.

The value of x in the $CoFe_x$ (layer can range from 0.0 to 0.95. The value of t in $CoFe_x$ t can be in a range of from 2 to 6 Å with from 3 to 4 Å being preferred.

We have also determined that further performance improvements can be arrived at by adding the following optional steps:
3). Inserting a surfactant layer (SL) or a nano-oxide layer (NOL) within AP2,
   i.e. seed/AFM/AP2a/SL/AP2b/PT/Ru4/$CoFe_x$/t/AP1/MgO/free layer/capping layer; or seed/AFM/AP2a/NOL/AP2b/PT/Ru4/$CoFe_x$t/AP1/MgO/free layer/capping layer.

Because of problems associated with increased resistance, the inserted SL or NOL should be weak. For example, a relatively a weak oxygen flow (typically about 0.05 SCCM) should be used when forming the SL at the AP2a interface and the thin CoFe or CoFeB layer should be only lightly oxidized when forming the NOL layer.
4). Thinning the AFM layer to reduce manganese diffusion as well as roughness.

For example, reducing an IrMn AFM that is normally 70 Å thick to a thickness that is in a range of from 40 to 50 Å, pinning still being robust enough because of the exceptionally high Hs of the Ru4 SyAP system. As an extreme case, the AFM layer could even be removed completely, thereby forming a thinner stack capable of providing improved pattern resolution.

Note that, since the TMR sensor is deposited on top of a magnetic shield made primarily of NiFe, it is necessary to ensure that the high temperature annealing of the TMR sensor does not disturb the easy direction of the magnetic shield. Fortunately, as is well known, the easy direction of the NiFe shield is securely oriented in the applied field direction when the annealing temperature is at a relative high value such as 300° C. so it (the easy direction) will stay fixed as long as any subsequent annealing temperature is below this.

Thus, in order to eliminate the possibility of unintended rotation of the NiFe shield's easy axis, the annealing sequence is performed in two steps: the first anneal takes place at a higher temperature, for example 320° C., with the magnetic field being applied in the same direction as the shield's easy direction, following which the second anneal is performed at a lower temperature such as, for example, 280° C., to set the pinning field direction in the hard direction as described earlier. In this way a higher TMR ratio along with an increased pinning field can be achieved without disturbing the magnetization of the NiFe shield.

Confirmation of the effectiveness of both the process and structure of the invention can be seen in the following:

FIG. 2 (*a*) shows the MH loop for:
Ta20/Ru20/IrMn70/CoFe23/PT100 sec/Ru4/CoFe(10%)4/CoFeB12/CoFe8/Ru10/Ta40/Ru30.

FIG. 2 (*b*) shows the MH loop for:
Ta20/Ru20/IrMn70/CoFe23/PT100 sec/Ru4/CoFe(25%)4/CoFeB12/CoFe8/Ru10/Ta40/Ru30.

'PT100 sec' signifies plasma etching in argon at a power level of 16 watt with an Ar gas flow rate of 120 SCCM for 100 sec.

Both samples were annealed using the two stage annealing sequence disclosed above. In this case first annealing was at 320° C. for 2 hours in an external field of 18 kOe applied along the easy direction and second annealing was at 280° C. for an additional 2 hours in an external field of 18 kOe applied along the hard direction. As can be seen, a high Hs field of more than 9000 Oe was achieved in both cases. This value is significantly greater than the 7,600 Oe achieved with Ru7.5 that was shown in FIG. 1(*a*) even though the annealing temperature was much higher for the FIG. 2 cases.

In summary, through optimization of Ru interfacial roughness and interfacial materials, we have been able to utilize the ultra-high saturation field of the first Ru synthetic coupling peak (Ru4) at a high annealing temperature to provide a robust pinning field for aTMR sensor that is able to tolerate a higher annealing temperature in order to achieve a better TMR ratio. The associated novel annealing sequence is also disclosed.

Figure 3:
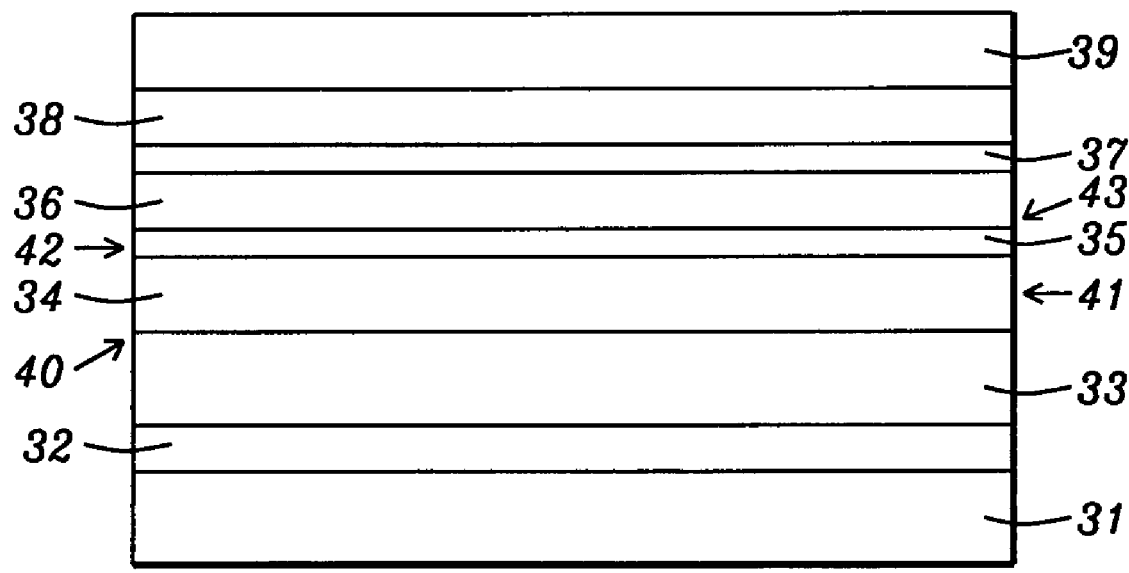
FIG. 3 illustrates both the structure as well as the principal novel process features of the invention.

FIG. 3 provides a graphic summary of both the structure of the invention as well as the disclosed process changes. Seen there are NiFe shield 31, seed 32, AFM layer 33, AP2 layer 34, Ru layer 35, AP1 layer 36, tunneling insulation layer 37 (generally MgOx), free layer 38, and capping layer 39. Also shown are the following pointers: 40 points to the first of three possible locations for performing a plasma treatment (PT), 41 points to a second possible location for PT, while 42 points to a third possible location for PT. The location pointed to by 41 is also suitable for inserting a surfactant layer and/or a nano-oxide layer (NOL). Finally, 43 points to a location suitable for the insertion of the $CoFe_x$ layer.

Advantages of the invention and the problems it solves, include:

A significant improvement in the pinning properties under higher annealing temperatures (300° C. and above) makes it possible for the TMR sensor to have a higher TMR ratio. It also makes it possible to thin down of the AFM layer, resulting in a lower thickness for the full stack. For example, for:
Ta8/Ru13/IrMn60/CoFe(25%)23/HPPT/Ru4/CoFe3/CoFeB12/CoFe9/capping, A Hs=9300 Oe was achieved after annealing at 320° C.
By contrast, for:
Ta8/Ru13/IrMn60/CoFe(25%)23/Ru7.5/CoFeB12/CoFe12/capping, a Hs=5000 Oe was the best that could be achieved after annealing at 320° C.

Note that although the invention has been described in terms of a TMR device, the spirit and underlying principles of the invention are applicable to MR based devices in general—wherever information is stored through comparing the magnetization of a free layer to that of a layer whose magnetization has been pinned in place through the application of synthetic anti-parallel coupling. Examples include, but are not limited to, GMR devices, dual spin valves, and magnetic field sensors.

What is claimed is:

1. A method to provide a tunneling magneto resistive (TMR) device with both a high internal pinning strength as well as with a high magneto-resistive (MR) ratio, comprising:
    prior to annealing said TMR device, reducing interfacial roughness of a ruthenium layer located between said TMR's first anti-parallel (AP1) layer and said TMR's second anti-parallel (AP2) layer;
    minimizing boron diffusion from said AP1 layer into said ruthenium layer; and
    minimizing manganese diffusion from a layer of antiferromagnetic (AFM) material into said ruthenium layer.

2. The method described in claim 1 wherein said TMR device has both a TMR ratio of at least 50% as well as an internal pinning strength of at least 5,000 Oe.

3. The method described in claim 1 wherein said ruthenium layer has a thickness between 3 and 4.5 Angstroms whereby it is optimized for causing and sustaining antiferromagnetic coupling between said AP1 and AP2 layers.

4. The method described in claim 1 wherein said AFM layer is IrMn.

5. The method described in claim 1, wherein there is no AFM layer in said TMR device.

6. A process for manufacturing a tunneling magneto resistive (TMR) device having both a high internal pinning strength as well as a high magneto-resistive (MR) ratio, comprising:
    providing an antiferromagnetic (AFM) layer on a seed layer that lies on a shield layer;
    depositing a secondary antiparallel layer (AP2) on said AFM layer;
    subjecting said AP2 layer to a plasma treatment;
    then depositing on said AP2 layer a layer of ruthenium to a thickness that is at a Ru4 peak;
    depositing a $CoFe_x$ layer on said ruthenium layer;
    depositing a primary antiparallel layer (AP1) on said $CoFe_x$ layer;
    depositing a tunneling insulation layer on said AP1 layer;
    depositing a magnetically free layer on said tunneling insulation layer;
    depositing a capping layer on said free layer;
    then subjecting all deposited layers to a first anneal at a temperature of at least 320° C. for at least 1 minute in the presence of an external magnetic field directed along said shield layer's easy direction; and
    then subjecting all deposited layers to a second anneal at a temperature that is at least 20° C. less than that used during said first anneal, for at least 5 minutes, in the presence of an external magnetic field directed along said ruthenium layer's hard direction.

7. The process recited in claim 6 wherein said TMR device has both a TMR ratio of at least 50% as well as an internal pinning strength of at least 5,000 Oe.

8. The process recited in claim 6 wherein said plasma treatment further comprises plasma etching or ion beam etching in argon at a power level in a range of from 5 to 50 watts at an Ar gas flow rate of 30 to 200 SCCM for 20 to 600 seconds.

9. The process recited in claim 8 wherein said plasma treatment is applied to a top surface of said AFM layer.

10. The process recited in claim 8 wherein said plasma treatment is applied to a top surface of said AP2 layer.

11. The process recited in claim 8 wherein said plasma treatment is applied within said AP2 layer as part of a growth process for said AP2 layer.

12. The process recited in claim 6 wherein, said layer of $CoFe_x$ has a thickness in a range of from 2 to 6 Å and x is in a range of from 0 to 0.95.

13. The process recited in claim 6 further comprising optionally inserting a surfactant layer within said AP2 layer.

14. The process recited in claim 6 further comprising optionally inserting a nano-oxide layer within said AP2 layer.

15. The process recited in claim 6 wherein said AFM layer is deposited to a thickness that is in a range of from to 0 to 50 Å, thereby improving spatial resolution of said TMR device.

16. A tunneling magneto resistive (TMR) device having both a high internal pinning strength as well as a high magneto-resistive (MR) ratio, comprising:
    an antiferromagnetic (AFM) layer on a seed layer that lies on a shield layer;
    on said AFM layer, a secondary antiparallel layer (AP2) that includes a plasma etch treated region;
    on said AP2 layer, a layer of ruthenium having a thickness that is an Ru4 peak for anti-parallel pinning;
    a $CoFe_x$ layer on said ruthenium layer;
    a primary antiparallel layer (AP1) on said $CoFe_x$ layer;
    a tunneling insulation layer on said AP1 layer;
    a magnetically free layer on said tunneling insulation layer;
    a capping layer on said free layer;
    said shield layer being magnetized along its easy direction; and
    said ruthenium layer being magnetized along its hard direction.

17. The TMR device described in claim 16 wherein said TMR device has both a TMR ratio of at least 50% as well as an internal pinning strength of at least 5,000 Oe.

18. The TMR device described in claim 16 wherein said plasma etch treated region is a top surface of said AFM layer.

19. The TMR device described in claim 16 wherein said plasma etch treated region is a top surface of said AP2 layer.

20. The TMR device described in claim 16 wherein said plasma etch treated region is within said AP2 layer.

21. The TMR device described in claim 16 wherein, said layer of $CoFe_x$ has a thickness in a range of from 2 to 6 Å and x is in a range of from 0 to 0.95.

22. The TMR device described in claim 16 further comprising an optional surfactant layer within said AP2 layer.

23. The TMR device described in claim 16 further comprising an optional nano-oxide layer within said AP2 layer.

24. The TMR device described in claim 16 wherein said AFM layer has a thickness in a range of from to 0 to 50 Å, whereby said TMR device has improved spatial resolution.

* * * * *